(12) United States Patent
Schaffer

(10) Patent No.: US 7,644,349 B2
(45) Date of Patent: Jan. 5, 2010

(54) INTERFACE CIRCUIT

(75) Inventor: Bernhard Schaffer, Villach (AT)

(73) Assignee: Infineon Technologies AG, Munich (DE)

( * ) Notice: Subject to any disclaimer, the term of this patent is extended or adjusted under 35 U.S.C. 154(b) by 774 days.

(21) Appl. No.: 11/429,407

(22) Filed: May 5, 2006

(65) Prior Publication Data

US 2007/0058437 A1    Mar. 15, 2007

(30) Foreign Application Priority Data

Sep. 12, 2005    (DE) .................. 10 2005 043 334

(51) Int. Cl.
*G06F 7/02* (2006.01)
*H03M 13/00* (2006.01)

(52) U.S. Cl. ..................................... 714/819
(58) Field of Classification Search ............. 714/746, 714/799, 819; 713/340; 337/20, 40.63, 77
See application file for complete search history.

(56) References Cited

U.S. PATENT DOCUMENTS

| 4,099,068 A | * | 7/1978 | Kobayashi et al. ............ 327/77 |
| 5,471,172 A | | 11/1995 | Chiu et al. |
| 5,986,345 A | | 11/1999 | Monnot |

OTHER PUBLICATIONS

Keil, Martin and Robert Weiβ. "System Engineering Automotive Application Note." Jan. 1999, Rel 01. Infineon Technologies AGx. (9 pages).

* cited by examiner

*Primary Examiner*—Shelly A Chase
(74) *Attorney, Agent, or Firm*—Maginot, Moore & Beck

(57) ABSTRACT

An interface circuit comprises at least one supply input and at least one data input with a protective circuit coupled between the at least one supply input and the at least one data input. A power supply circuit is coupled to the at least one supply input. The interface circuit further comprises an error detection circuit coupled to the supply input and to the at least one data input. The error detection circuit is designed to compare a supply signal applied to the supply input with a data signal applied to the at least one data input and to generate an error signal on the basis of the comparison result.

20 Claims, 6 Drawing Sheets

— S1, Sn
—·— VDDext, VDDint

INTERFACE CIRCUIT

FIELD

The present invention relates to an interface circuit having a supply input for applying a supply potential and having at least one data input for supplying a data signal and also having a protective circuit connected between the at least one data input and the supply input.

BACKGROUND

An interface circuit of this type is sufficiently well known and is described in "System Engineering Automotive Application Note, Reverse Polarity Protection for ECU (PROFET BTSxxx, Microcontroller C16x, TLE426x)", 01.99, Rel 01, Infineon Technologies AG, Munich, for example.

FIG. 1 shows an interface circuit of this type. This interface circuit has two supply inputs, a first supply input IN_VDD for applying a first supply potential VDDext and a second supply input IN_VSS for applying a second supply potential VSSext. By way of example, the first supply potential VDDext is a positive supply potential, whereas the second supply potential VSSext is a negative supply potential or reference-ground potential, particularly ground. The interface circuit 1 also has data inputs IN_D1, IN_Dn for supplying data signals S1, Sn, which are provided by a second circuit 2, for example. A power supply circuit 20, which may be in the form of a voltage regulator, in particular, is designed to take an internal supply potential VDDint, which is available at the first supply input IN_VDD in the interface circuit 1, and to generate a regulated supply voltage VDD which is used to supply power to further circuit components, for example a signal processing circuit 80 which is connected to the interface circuit 1. This signal processing circuit 80 may contain an input stage 81 and a processing stage 82. By way of example, the input stage 81 is used to convert the signals applied to the data inputs IN_D1, IN_Dn into signals with signal levels which are suitable for the processing in the processing stage 82.

Connected between the data inputs IN_D1, IN_Dn and the supply inputs IN_VDD, IN_VSS is an ESD protective circuit 10 whose task is to protect the data inputs IN_D1, IN_Dn against overvoltages. In this case, a diode 11, 12, 13, 14 is connected between each of the data inputs IN_D1, IN_Dn and each of the supply inputs IN_VDD, IN_VSS. The diodes 11, 13 connected between the data inputs IN_D1, IN_Dn and the first supply input IN_VDD ensure that the potentials at the data inputs IN_D1, IN_Dn can rise above the value of the positive supply potential VDDext by no more than the value of the forward voltage of a diode. The diodes 12, 14 connected between the second supply input IN_VSS and the respective data inputs IN_D1, IN_Dn ensure that the potentials on the data inputs IN_D1, IN_Dn can drop below the negative supply potential or reference-ground potential VSSext by no more than the value of the forward voltage of a diode. To protect an overvoltage between the supply inputs IN_VDD, IN_VSS, there is optionally also a zener diode 15 connected between these supply inputs.

An error situation will now be considered in which the power supply for the circuit 1 is interrupted, whether by an interruption in an external connecting line connected to the first supply input IN_VDD or by an interruption in a line connected to the first supply input IN_VDD internally in the circuit 1. Such interruptions in the supply line are shown schematically in FIG. 1 and are denoted by the reference symbols 101, 102.

A power supply for the circuit, i.e. the generation of a supply voltage VDD via the power supply arrangement 20, can still be ensured under certain conditions, specifically via the data inputs IN_D1, IN_Dn, when such an error occurs. The data signals D1, Dn applied to these inputs each comprise a series of voltage pulses which can assume a lower and an upper signal level. If the internal supply potential VDDint drops as a result of an interruption in the external supply, the diodes 11, 13 are operated in the forward direction when the data signals have upper signal levels, which means that despite the interrupted external supply an internal supply potential VDDint which is not equal to zero is applied to an input 21 of the power supply arrangement 20, which generates the supply voltage VDD from it.

However, it is normally not desirable for the internal supply potential VDDint to be maintained via the data inputs in this way. Although an operational circuit is simulated externally, supplying power to the circuit 1 via the data inputs IN_D1, IN_Dn and the parasitic current paths via the diodes 11, 13 of the protective circuit 10 produces operating conditions which, in the long term, can result in the circuit being damaged or even destroyed. By way of example, the diodes 11-15 in the protective circuit 10 are normally not designed for permanently flowing currents, which means that they can heat up to an impermissible extent in the event of a permanent flow of current. If the circuit 1 is in the form of an integrated circuit on a semiconductor substrate, depending on the implementation of the diodes there may also be a permanent flow of currents into the substrate, which in turn can have an adverse effect on the operation of other circuit components integrated on this substrate. Finally, one result may be that the power supply arrangement 20 is not or not permanently capable of generating the supply voltage VDD in stable fashion from an internal supply potential VDDint which results from the data signals S1, Sn, which can lead to malfunctions in the signal processing circuit 82 which the power supply arrangement 20 feeds.

It is therefore necessary to be able to identify such an interruption in the power supply in good time. This could be done by comparing the voltage VDDint applied to the supply input IN_VDD internally with a threshold voltage in order to be able to identify a drop in this voltage after a line interruption. However, such a comparison is difficult to implement if the circuit 1 permits a relatively wide supply voltage range for the supply voltage, which corresponds to the difference between the first and second supply potentials VDDext, VSSext, that is to say if the power supply circuit 20 is designed to generate the regulated supply voltage VDD from a varying input voltage.

In addition, the data inputs IN_D1, IN_Dn could have series resistors connected upstream of them which, if the supply voltage at the first supply input IN_VDD intermits, would prevent the circuit from being supplied with power via the data inputs IN_D1, IN_Dn and the parasitic current paths of the diodes 11, 13 in the protective circuit 10. However, such resistors increase the implementation costs of the circuit and also impair the input signals on the data inputs.

Such resistors could also be connected as integrated resistors in series with the diodes of the protective circuit 10. However, there is the risk that these resistors can be destroyed by peak currents, as occur in the case of electrostatic discharges (ESDs), for example.

It would therefore be advantageous to provide an interface circuit having at least one supply input for supplying a supply potential and having at least one data input for supplying a data signal and also having a protective circuit connected between the at least one data input and the at least one supply input and having a power supply circuit connected to the at least one supply input, in which an interruption in a power supply on the at least one supply input can be detected without giving rise to the drawbacks mentioned at the outset.

SUMMARY

Disclosed herein is an interface circuit comprising at least one supply input and at least one data input. A protective circuit is coupled between the at least one supply input and the at least one data input. The interface circuit also comprises a power supply circuit coupled to the at least one supply input. In addition, the interface circuit comprises an error detection circuit coupled to the supply input and to the at least one data input. The error detection circuit is designed to compare a supply signal applied to the supply input with a data signal applied to the at least one data input and to generate an error signal on the basis of the comparison result.

In one embodiment, the error detection circuit is designed to generate an error-indicating level for the error signal when a sum made up of the supply signal applied to the at least one supply input and an offset is smaller than the data signal applied to the at least one data input.

In one embodiment, the error detection circuit comprises at least one comparator connected to the at least one supply input and to the at least one data input. In this embodiment, the comparator provides a comparator signal, and the error signal is dependent on the comparator signal.

In another embodiment, the error detection circuit comprises a level reduction circuit connected to the at least one supply input and to the at least one data input. The level reduction circuit is configured to receive at least one supply signal applied to the at least one supply input and at least one data signal applied to the at least one data input. The level reduction circuit generates at least one reduced-level supply signal and at least one reduced-level data signal. The level reduction circuit is further connected to a comparator circuit, wherein the at least one reduced-level supply signal and the at least one reduced-level data signal are supplied to the comparator. With this configuration, the comparator outputs the error signal.

The above described features and advantages, as well as others, will become more readily apparent to those of ordinary skill in the art by reference to the following detailed description and accompanying drawings.

BRIEF DESCRIPTION OF THE DRAWINGS

In the figures, unless stated otherwise, identical reference symbols denote the same circuit components and signals with the same meaning.

DESCRIPTION

Figure 1:
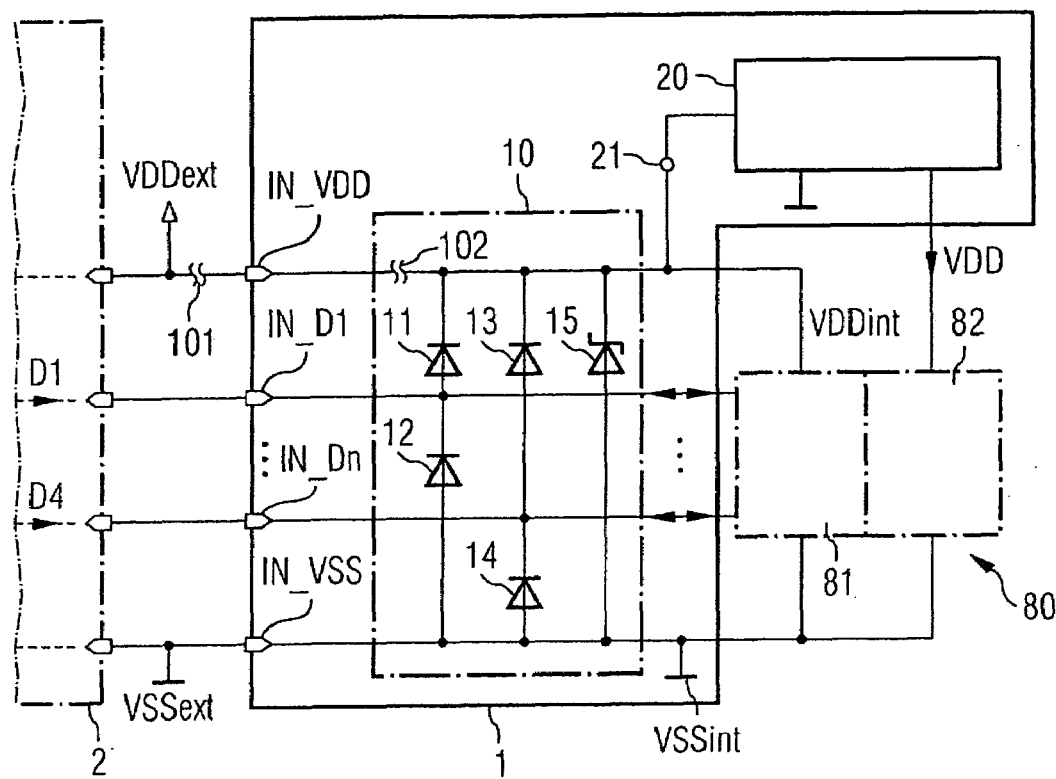
FIG. 1 shows a circuit arrangement having an interface circuit based on the prior art.

An interface circuit comprises at least one supply input and also at least one data input and a protective circuit, which is connected between the at least one supply input and the at least one data input, and a power supply circuit coupled to the at least one supply input. In addition, an error detection circuit is provided which is coupled to the at least one supply input and to the at least one data input and which is designed to compare a supply signal applied to the supply input with a data signal applied to the at least one data input and to generate an error signal on the basis of the comparison result.

In one embodiment of the invention, the error detection circuit is designed to generate an error-indicating level for the error signal when a sum made up of the supply signal applied to the supply input and an offset is smaller than the data signal applied to the at least one data input.

The invention makes use of the fact that when such an interface circuit is operating correctly, that is to say when there is no interruption in the power supply on the supply input, the potential on the supply input is in a known ratio with a maximum potential on the data inputs, assuming that the data signals are generated from the supply potential which is applied to the supply input during fault-free operation. Depending on the manner in which the data signals supplied to the data inputs of the interface circuit are generated, the maximum potential on the data inputs may correspond to the supply potential which is supplied to the supply input during correct operation.

In the event of an interruption in the power supply on the supply input, the potential on the supply input assumes a potential which is below the potential on the at least one data input, as a result of the protective circuit coupled between the at least one data input and the supply input. This drop in potential is detected by the error detection circuit, and an error signal with a level indicating this error is generated.

The offset which is included in a comparison between the potential on the supply input and the potential on the data input and which is dependent on the manner in which the data signals are generated, which is assumed to be known, is preferably greater than zero, namely when a maximum value for the data signal is equal to the supply potential supplied to the interface circuit externally. Such an offset is required in order to increase the signal-to-noise ratio, since otherwise overshoots appearing on the data lines would result in an error situation being indicated even under correct operating conditions.

In an embodiment in which the interface circuit has at least two data inputs, the error detection circuit is designed to generate an error-indicating level for the error signal when a sum made up of the supply signal applied to the at least one supply input and an offset is smaller than the data signal on at least one of these at least two data inputs.

Preferably, the error detection circuit has a level reduction circuit which is connected to the at least one supply input and to the at least one data input and which takes the signals applied to these inputs and generates at least one reduced-level supply signal and at least one reduced-level data signal. In this case, the supply signal is reduced by a reduction value to a prescribed nominal value, and the data signals are each reduced by the same reduction value, so that a difference between the supply signal and the data signals corresponds to a difference between the reduced-level supply signal and the reduced-level data signal.

If appropriate, the level reduction circuit additionally reduces the level of the at least one data signal by the value of an offset which is to be allowed for between the supply signal and the data signal. This level reduction circuit, which "normalizes" the level of the supply signal to a prescribed value and which reduces the level of the at least one data signal as appropriate, allows simple comparison of the supply signal and the at least one data signal which does not need to be designed to compare input signals having a wide range of fluctuations.

Figure 2:
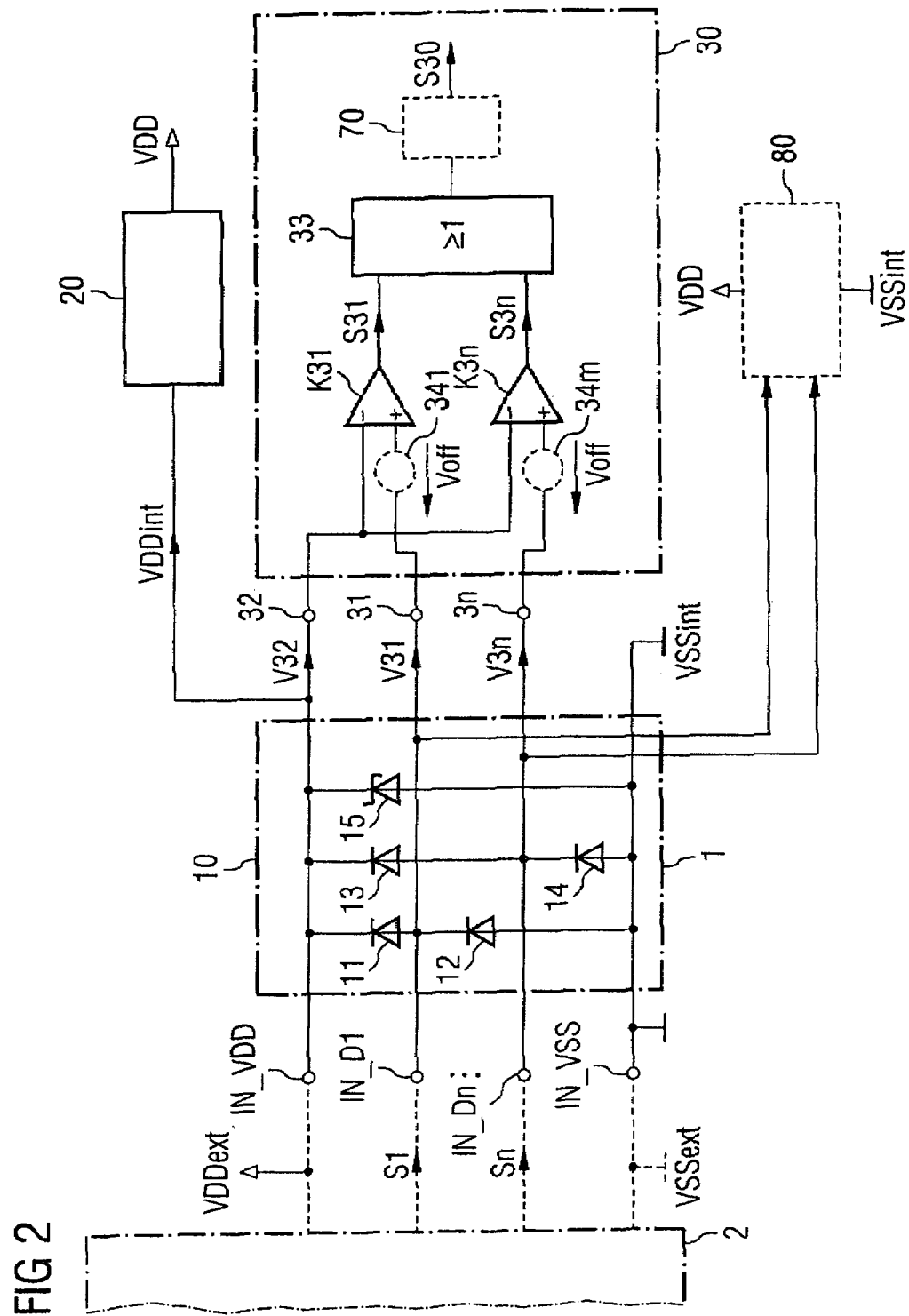
FIG. 2 shows a first exemplary embodiment of an inventive interface circuit which generates an error signal on the basis of a comparison between a supply signal and two data signals.

With reference now to FIG. 2, a first exemplary embodiment of the inventive interface circuit is shown. This interface circuit comprises a first supply input IN_VDD, to which a positive external supply potential VDDext is applied during correct operation. A second supply input IN_VSS of this interface circuit has a negative supply potential or reference-ground potential VSSext, particularly ground potential, applied to it during correct operation. A voltage applied between the first and second supply inputs IN_VDD, IN_VSS forms the supply voltage. For the explanation which follows, it is assumed that the second supply potential VSSext is a reference-ground potential, which means that the value of the supply voltage corresponds to the positive supply potential VDDext.

The interface circuit also comprises at least one data input—two data inputs IN_D1, IN_Dn in the exemplary embodiment shown in FIG. 2. The dots between these two data inputs IN_D1, IN_Dn already indicate that the interface circuit can easily be expanded by providing any other data inputs.

The data inputs IN_D1, IN_Dn have data signals S1, Sn applied to them during correct operation of the interface circuit. These data signals S1, Sn are each pulse trains containing voltage pulses which are modulated in suitable fashion for data transmission. These data signals S1, Sn are generated by a transmission circuit 2 (shown in dashes in FIG. 2), for example, which is likewise supplied with the external supply potential VDDext. This transmission circuit 2 generates the data signals S1, Sn as dual-value signals with a lower and an upper signal level, for example, with the upper signal level corresponding to the supplied external supply potential VDDext.

The interface circuit comprises an ESD protective circuit 10 having a plurality of diodes, with one respective diode 11, 13 being connected between one of the data inputs IN_D1, IN_Dn and the first supply input IN_VDD, and one respective diode 12, 14 being connected between the second supply input IN_VSS and a respective one of the data inputs IN_D1, IN_Dn. In the event of ESD faults, that is to say faults which can be attributed to electromagnetic discharges (ESD=Electrostatic Discharge), these diodes ensure that the potentials at the data inputs IN_D1, IN_Dn can rise above the value of the potential at the first supply input IN_VDD by no more than the value of the forward voltage of a diode and can drop below the value of the potential on the second supply input IN_VSS by no more than the value of the forward voltage of a diode. A zener diode 15 which is connected between the two supply inputs IN_VDD, IN_VSS limits the voltage applied between these supply inputs IN_VDD, IN_VSS to the value of the breakdown voltage of the zener diode 15 in the event of a fault which affects the supply inputs IN_VDD, IN_VSS. Instead of this zener diode, any element having a breakdown characteristic may be used, that is to say any component which is conductive when a voltage applied to its connections is exceeded.

In FIG. 2, VDDint denotes a supply potential which is available at the first supply input IN_VDD internally in the interface circuit and which, during correct operation, corresponds to the external supply potential VDDext and which is supplied to an input 21 of a power supply arrangement 20 which generates a—preferably regulated—supply voltage VDD for a signal processing circuit 80 to which the data signals S1, Sn are supplied for further processing. This signal processing circuit 80 is not the subject matter of the present invention and is shown in FIG. 2 merely to improve understanding, where it is denoted by the reference symbol 80.

VSSint in FIG. 2 denotes a second supply potential or internal reference potential, available internally in the interface circuit and for the signal processing circuit 80, which corresponds to the external negative supply potential VSSext during correct operation.

For the purpose of detecting an interruption in the power supply on the first supply input IN_VDD, an error detection circuit 30 is provided which is connected to the first supply input IN_VDD via a first input 32 and to the data inputs IN_D1, IN_Dn via further inputs 31, 3n. The first input 32 of this error detection circuit 30 is supplied with a supply signal V32, which corresponds to the external supply potential VDDext during correct operation. The further inputs 31, 3n are used to supply the error detection circuit 30 with first and second data signals V31, V3n, which correspond to the data signals S1, Sn applied to the data inputs IN_D1, IN_Dn during correct operation.

The error detection circuit 30 shown in FIG. 2 has a number of comparators K31, K3n which corresponds to the number of data inputs IN_D1, IN_Dn—a first comparator K31 and a second comparator K3n in the example. The first comparator K31 compares the first data signal V31 with the supply signal V32 and generates a first comparator signal S31 on the basis of this comparison. The second comparator K3n compares the second data signal V3n with the supply signal V32 and generates a second comparator signal S3n on the basis of this comparison. In the example, the two comparators K31, K3n are respectively connected up such that their output signal assumes a high level when the data signal V31, V3n supplied to the respective comparator K31, K3n is larger than the supply signal V32. For this purpose, the data signals V31, V32 are supplied to the positive inputs of the comparators K31, K3n and the supply signal V32 is supplied to the negative inputs.

The positive inputs of these comparators K31, K3n optionally have offset voltage sources 341, 34n connected upstream of them which reduce the data signals V31, V3n supplied to the respective comparator K31, K3n by the value of an offset voltage Voff. These offset voltage sources 341, 34n are required when the data signals S1, Sn are able to have maximum signal levels which are above the external supply potential VDDext by the value of a prescribed offset. Such an offset between the maximum level of the data signals and the external supply potential VDDext can result from the data signals overshooting during operation of the circuit, which is explained below with reference to FIG. 8.

Figure 8:
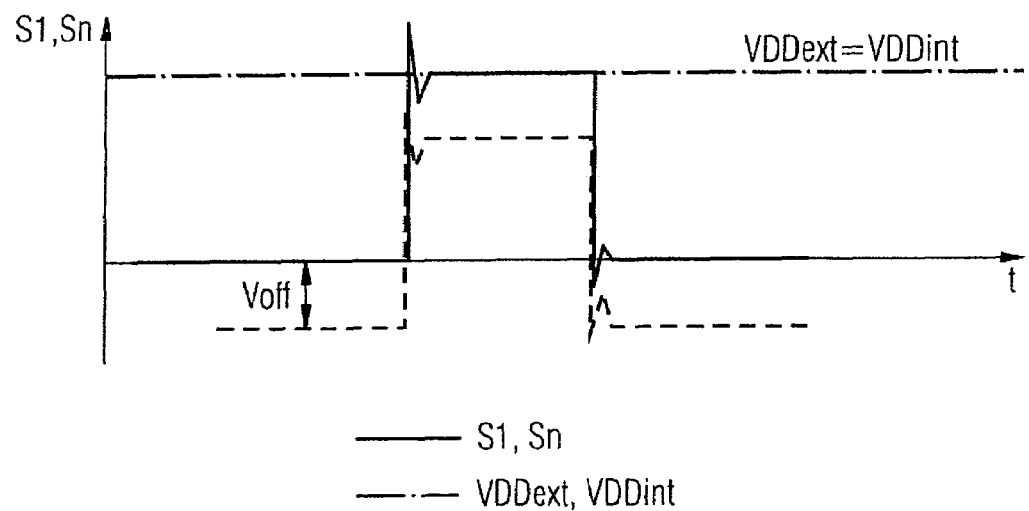
FIG. 8 shows an example of the time profile for one of the data signals and the time profile for this data signal corrected by an offset value.

FIG. 8 shows an example of the time profile for one of the data signals S1, Sn, which changes from a low level to a high level, at which the amplitude of the signal assumes the value of the external supply potential VDDext, at a time t0. During the rising edge of this signal, an overshoot occurs which causes the amplitude of the signal S1, Sn to rise briefly above the value of the external supply potential VDDext, whose level is shown in dashes and dots in FIG. 8. To prevent this overshoot from being detected as an error, the data signal S1, Sn is reduced by the aforementioned offset value Voff, and the reduced value is compared with the internal potential VDDint, which matches the external potential VDDext during correct operation. The signal reduced by the offset value is shown in dashes in FIG. 8.

The offset voltages Voff from the offset voltage sources 341, 34n are in this case in the range of this offset which the data signals have over the external supply potential.

Preferably, the offset voltages Voff are somewhat larger than the amplitudes of a typical overshoot in the data signals S1, Sn and V31, V3n over the external supply potential VDDext. This ensures that during correct operation, that is to say when the external supply potential VDDext corresponds to the internal supply potential VDDint or the supply signal V32, the input signals at the positive inputs of the comparators K31, K3n are smaller than the supply potential V32 which is supplied to the negative inputs of these comparators K31, K3n. During correct operation, the output signals S31, S3n from the comparators K31, K3n therefore each assume a low level.

The offset voltage Voff from the offset voltage sources 341, 34n also needs to be matched to the forward voltages of the diodes 11, 13 such that they are lower than these forward voltages, so that in the error situation the signals at the positive inputs of the comparators K31, K3n are even larger than the supply signal V32. This will be explained below with reference to an example.

It will be assumed that the upper signal level of the data signal Sn or V3n assumes a value for which the following is true:

$$V3n\_max = VDDext + 0.5\ V \quad (1)$$

and that Vd=0.7 V (at 27° C.) is true for a forward voltage Vd of the diodes 11, 15. The offset voltages Voff are then chosen so that the following is true: 0.5 V<Voff<0.7 V (at 27° C.). This ensures that during correct operation the signals at the positive inputs of the comparators are smaller than the supply signal V32 and during incorrect operation they are larger than this supply signal V32.

Allowing for the fact that the forward voltage of the diodes 11, 15 in the protective circuit 10 is temperature-dependent and decreases as temperature rises, the offset voltage Voff is preferably generated in temperature-compensated fashion, specifically such that the offset voltage Voff likewise increases as temperature rises.

Figure 7:
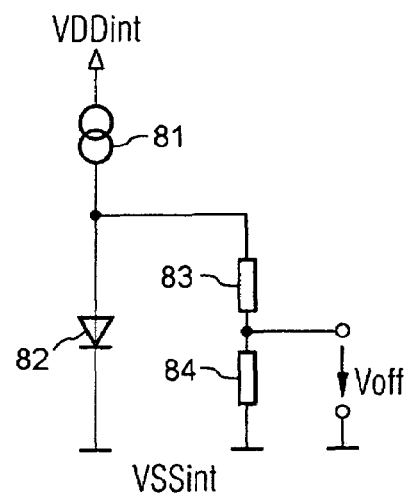
FIG. 7 shows an example of implementation for a temperature-compensated offset voltage source.

An example of an offset voltage source which generates a temperature-compensated offset voltage Voff is shown in FIG. 7. This circuit comprises a diode 82 which is connected in series with a current source 81 between supply voltage terminals, for example the terminals for the internal upper and lower supply potentials VDDint, VSSint. The diode 82 has a constant current flowing through it which is delivered by current source 81 and which brings about a voltage drop across the forward-biased diode 82, said voltage drop decreasing as temperature rises on account of the temperature characteristic of the diode 82. This voltage across the diode 82 is tapped off using a high-resistance voltage divider 83, 84 and is divided down to the offset voltage Voff.

The comparator signals S31, S3n are logically combined by a logic gate 33—by an OR gate in the example—to form an error signal S30, which likewise assumes a low level during correct operation.

If there is now an interruption in the power supply on the supply input IN_VDD, the supply signal V32 drops and, at most, assumes a signal value which is below the value of the upper signal level of the data signals S1, Sn by the value of the forward voltages of the diodes 11, 13. During the time period during which one of the data signals S1, Sn assumes an upper signal level, the signal amplitude of the signal applied to the positive input of at least one of the comparators K31, K3n is above the supply signal V32, which means that at least one of the comparator output signals S31, S3n assumes a high level and which means that the error signal S30 accordingly assumes a high level. This high level of the error signal S30 indicates an error state, i.e. an interruption in the power supply.

Optionally, the OR gate 33 has a monoflop 70 connected downstream of it which is set as soon as the output signal from the OR gate 33 ever assumes a high level. Using this monoflop makes sense if the data signals assume upper signal levels suitable for the comparison with the supply signal V32 only intermittently.

In the exemplary embodiment shown in FIG. 2, the comparators K31, K3n in the error detection circuit 30 need to be designed to compare input signals which may be subject to common-mode signal fluctuations, namely when the external supply potential VDDext can be within a prescribed range of fluctuation, for example 3.3 V . . . 5 V. Implementing such comparators which operate over a prescribed common-mode fluctuation range can be complex, however.

Figure 3:
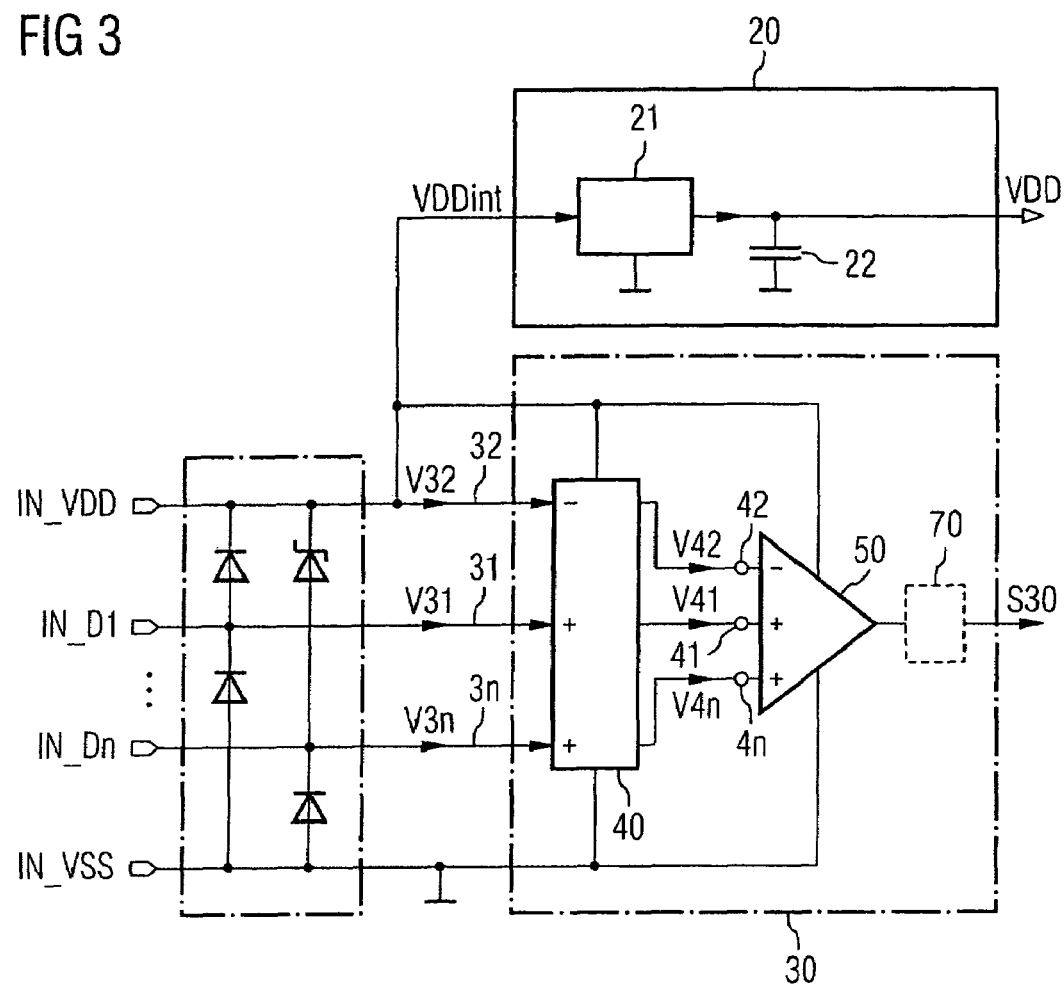
FIG. 3 shows a block diagram of a further inventive interface circuit which has a level reduction circuit and a comparator arrangement connected downstream of the level reduction circuit.

FIG. 3 shows an example of implementation for the inventive interface circuit in which no comparators are needed which operate over a wide common-mode fluctuation range. In this case, the error detection circuit 30 has a level reduction circuit 40 and a comparator circuit 50 which is connected downstream of the level reduction circuit 40. The level reduction circuit 40 reduces the signal levels of the supply signal V32 and the signal levels of the data signals V31, V3n in a manner which is yet to be explained, so as to generate a reduced-level supply signal V42 and reduced-level data signals V41, V4n. In this case, the supply signal V32 is preferably reduced to a prescribed signal value V42, and the data signals are each reduced by the same value as the supply signal V32—possibly additionally by an offset value, so that the difference between the data signals V41, V4n and the supply signal V42 corresponds to the difference between the data signals V31, V3n applied to the inputs 31, 3n and the supply signal V32.

The reduced-level signals V41, V42, V4n are supplied to the comparator arrangement 50, which does not need to be designed to compare signals which may be subject to common-mode fluctuations.

Figure 4:
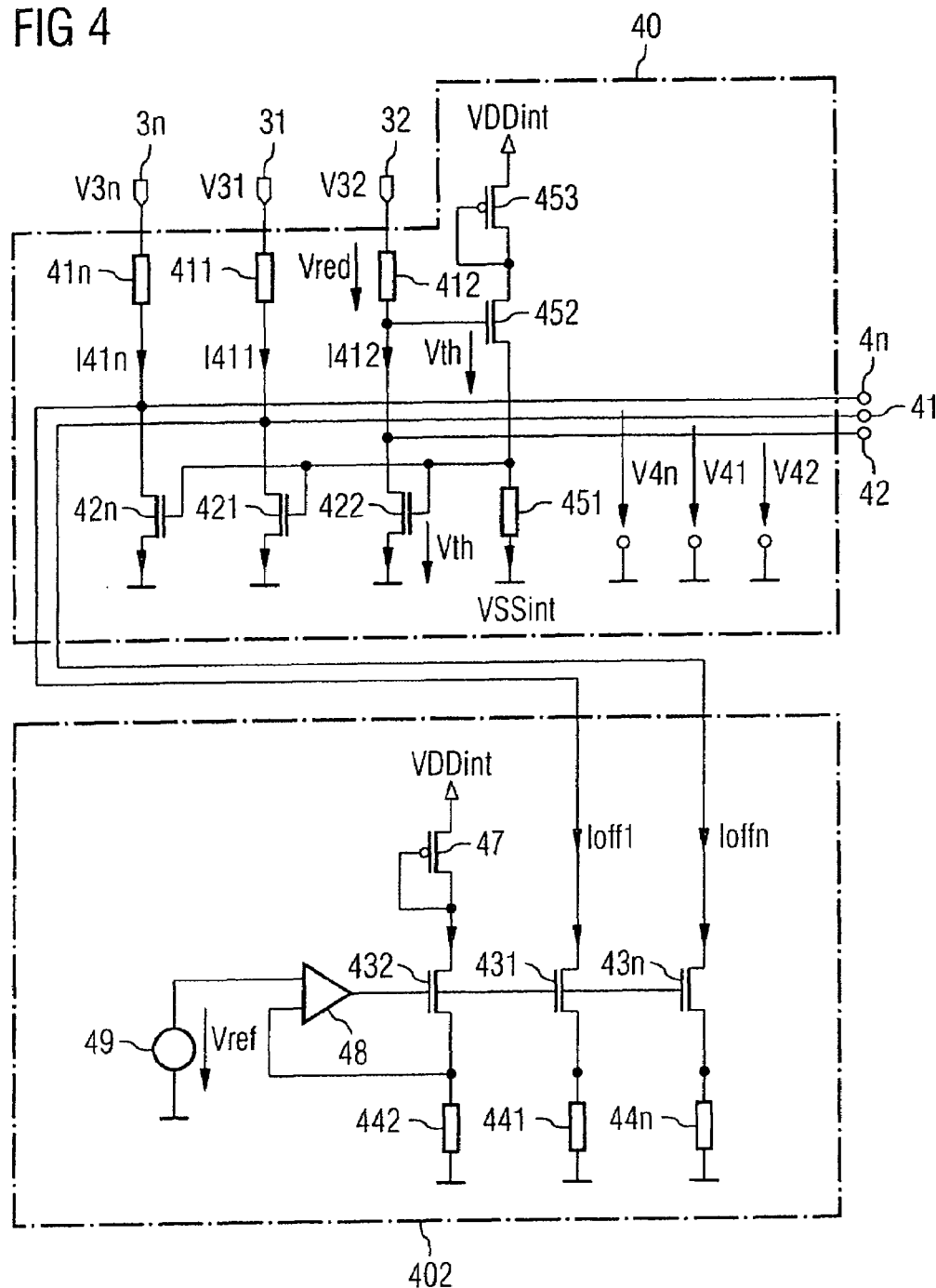
FIG. 4 shows an example of circuit implementation for the level reduction circuit.

FIG. 4 shows a possible example of circuit implementation for the level reduction circuit 40. This level reduction circuit 40 has respective series circuits comprising resistors 41n, 411, 412 and current-regulating transistors 42n, 421, 422 between the data inputs 3n, 31 and a terminal for the internal lower supply potential VSSint and between the supply signal input 32 and this terminal for the lower supply potential VSSint. The outputs 4n, 41, 42 of this level reduction circuit are respectively formed by the nodes in the series circuits which are common to the resistors 41n, 411, 412 and the current-regulating transistors 42n, 421, 422.

The series circuit 412, 422 connected between the supply input 32 and the lower supply potential VSSint is part of a control circuit which sets a current I412 through the resistor 412 such that the reduced-level supply signal V42 assumes a prescribed nominal value. To this end, the control circuit has a further resistor 451, which is connected in series with a further transistor 452 between a terminal for the internal supply potential VDDint and the terminal for the lower supply potential VSSint. An optionally provided transistor 453 which is connected up as a diode and which is connected in series with the transistor 452 and the resistor 451 is used as a voltage limiter for the transistor 452 and improves the latter's robustness in the face of ESD interference pulses, that is to say improves its ESD strength.

The gate connection of the transistor 452 in the control circuit is connected to the output 42, to which the reduced-level supply signal V42 is applied. In this control circuit, where the current through the resistor 451 controls the current-regulating transistor 422, the reduced-level supply signal V42 is adjusted to a value which corresponds to twice the threshold voltage Vth of the current-regulating transistor 422 and of the further control transistor 452. This threshold voltage is a technology-dependent value for the transistors, which are in the form of NMOS transistors in the example. The transistor 453 connected up as a diode is a PMOS transistor.

In the circuit shown in FIG. 4, the following is therefore true:

$$V42 = 2 \cdot Vth \quad (2).$$

In this case, Vth denotes the technology-dependent threshold voltage of the NMOS transistors in the level reduction circuit 40.

The resistors 41n, 411, 412 connected downstream of the inputs 3n, 31, 32 are each rated the same. Accordingly, the current-regulating transistors 42n, 421, 422 are each rated the same. The two current-regulating transistors 42n, 421 connected downstream of the data signal inputs 3n, 31 are actuated via the control circuit in the same way as the current-regulating transistor 422 connected downstream of the supply signal input 32. The currents I41n, I411 flowing through these current-regulating transistors 42n, 421 therefore correspond to the current I412 through the current-regulating transistor 422.

The reduced-level supply signal V42 is produced from the supply signal V22 by subtracting a reduction value Vred which corresponds to the product of the regulated current I412 and the value of the resistor 412, that is to say that the following is true:

$$Vred = I412 \cdot R412 \quad (3).$$

In this case, R412 denotes the resistance value of the resistor 412. On account of the same rating for the resistors 41n, 411, 412 and the same actuation for the current-regulating transistors 42n, 421, 422, the following is true for the reduced-level data signals V4n, V41:

$$V4n = V3n - Vred \quad (4a)$$

$$V41 = V31 - Vred \quad (4b).$$

The reduced-level output signals V4n, V41, V42 are therefore produced from the input signals V3n, V31, V32 by reducing them by a reduction value Vred, the supply signal V32 always being normalized to the same constant value V42. In this case, the differences between the data signals V3n, V31 and the supply signal V32 correspond to the differences between the reduced-level data signals V4n, V41 and the reduced-level supply signal V42.

Optionally, the level reduction circuit 40 has an offset current source arrangement 402 which is connected to the outputs 4n, 41 for the reduced-level output signals. This offset current source arrangement brings about an additional current Ioff1 through the first resistor 411, which is connected downstream of the first data input 31, and an offset current Ioffn through the resistor 41n, which is connected downstream of the second data input 3n, as a result of which the reduced-level data signals V4n, V41 are reduced further. Assuming that the two offset currents Ioff1, Ioffn are the same, so that Ioff1=Ioffn=Ioff is true, the following are obtained for the reduced-level data signals:

$$V4n = V3n - Vred - Voff \quad (5a)$$

$$V41 = V31 - Vred - Voff \quad (5b).$$

In this case, Voff represents an offset voltage which corresponds to the product of the offset current Ioff and the respectively identical resistance values of the resistors 411, 41n.

The offset current source arrangement 402 comprises a control arrangement having three current-regulating transistors 43n, 431, 432. Connected in series with these current-regulating transistors 43n, 431, 432, which are each rated the same, are nonreactive resistors 44n, 441, 442, which are likewise each rated the same. The current-regulating transistors 43n, 431, 432 are actuated by an operational amplifier 48 which compares a voltage V442 across the resistor 442 with a reference voltage Vref provided by a reference voltage source 49 and which actuates the current-regulating transistor 432 such that the voltage drop V442 across this resistor 442 corresponds to the reference voltage Vref. The current flowing through this current-regulating transistor 432 then corresponds to the quotient of the reference voltage Vref and the resistance value R442 of this nonreactive resistor 442. A further transistor 47, which is connected up as a diode and which is connected in series with the current-regulating transistor 432, is used for voltage limiting and is connected to the internal supply potential VDDint by means of its load connection which is remote from the current-regulating transistor 432. This further transistor is optionally present.

Figure 6:
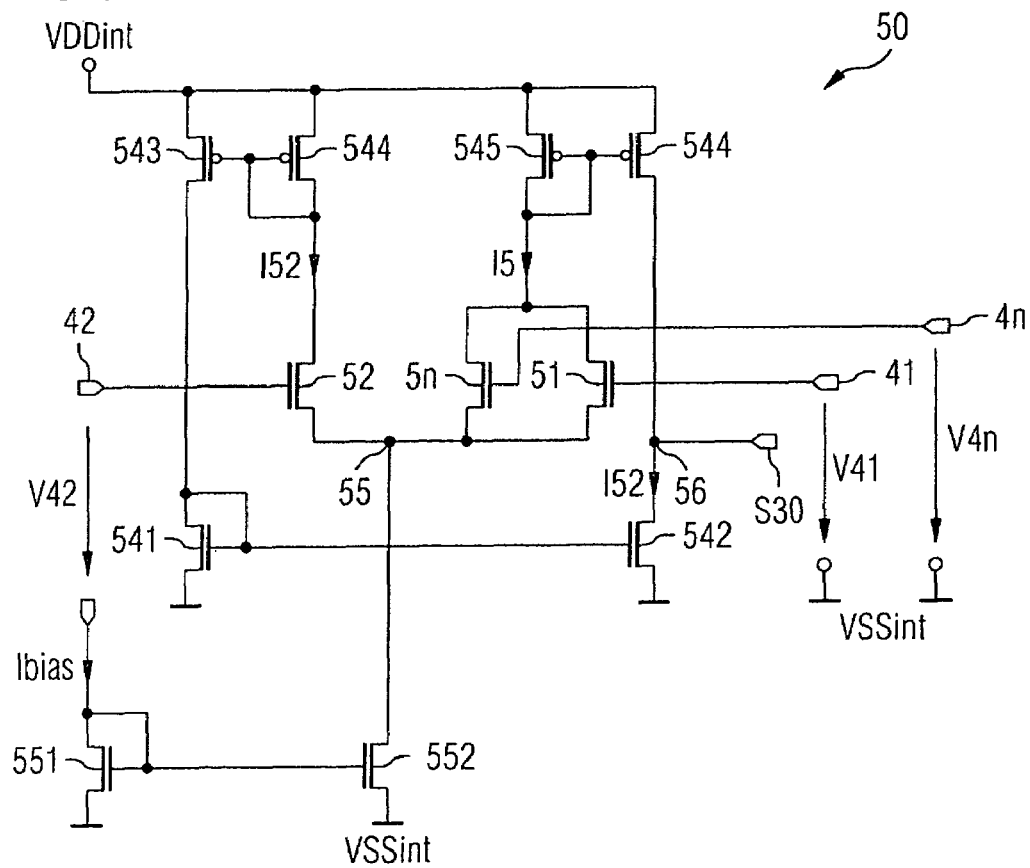
FIG. 6 shows an example of circuit implementation for the comparator arrangement.

The offset currents Ioff1, Ioffn correspond to the regulated current flowing through the current-regulating transistor 432 on account of the current-regulating transistors 43n, 431 being rated the same and the resistors 44n, 441 being rated the same. To generate a temperature-compensated offset voltage, the offset currents can be generated so as to be temperature-dependent such that their amplitude decreases as temperature rises. To this end, the reference voltage source 49 may be in the form of a voltage source as shown in FIG. 6, this circuit possibly being able to have a plurality of diodes—corresponding to the diode 62 in FIG. 6—connected in series in order to generate a temperature-dependent voltage of relatively large amplitude which is suitable as a reference voltage Vref.

Figure 5:
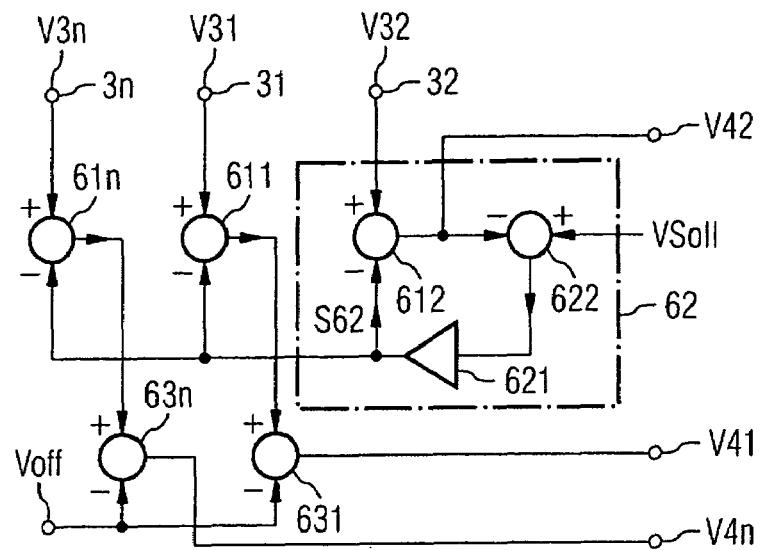
FIG. 5 illustrates the basic concept of the level reduction circuit.

The basic operating principle of the level reduction circuit is shown in FIG. 5. In this case, a control circuit 62 is supplied with the supply signal V32 and with a nominal signal Vnominal. This control circuit 62 comprises a controller 621 which sets a control signal S62, subtracted from the supply signal 32 by means of a subtractor 612, such that the difference between the supply signal V42 and the nominal signal Vnominal becomes practically 0V. In this case, the input of the controller is supplied with the difference between the reduced-level supply signal V42 and the nominal signal Vnominal. The controller 621 may be any controller, particularly a controller with an integrating response (I response), a proportional response (P response) or a proportional-integral response (PI response).

The control signal S62 is supplied to further subtractors 611, 61n in order to subtract the control signal from the data signals V3n, V31 in appropriate fashion. Outputs of these subtractors 61n, 611 provide the reduced-level data signals V4n, V41, V42, these signals optionally being reduced by an offset value Voff using further subtractors 63n, 631, in order to generate the reduced-level data signals V41, V4n.

In this context, the control signal S62 in FIG. 5 corresponds to the reduction value Vred shown in FIG. 4.

The offset value Voff explained with reference to FIGS. 4 and 5, which is subtracted from the data signals V3n, V31, corresponds to the offset value Voff which has already been explained with reference to FIG. 2.

FIG. 6 shows an example of circuit implementation for the comparator arrangement 50, which compares the reduced-level data signals V4n, V41 with the reduced-level supply signal V42.

This comparator arrangement has a differential input stage with a first input transistor 52, to whose control connection the supply signal 42 is supplied, and with parallel-connected second and third input transistors 4n, 41, whose control connections are respectively supplied with one of the first and second data signals V41, V4n. First load connections—the source connections in the example shown—of the input transistors in the form of NMOS transistors are connected to a common summation point 55. Connected between this summation point 55 and the lower supply potential VSSint is a constant current source which supplies a constant current Ibias to the summation point 55. This constant current source is in the form of a current mirror with a first current-mirror transistor 551, connected up as a diode, and a second current-mirror transistor 552, connected between the summation point 55 and the lower supply potential VSSint.

The first input transistor 52 has a first current I52 flowing through it which is dependent on the supply signal V42. The parallel circuit comprising the second and third input transistors 5n, 51 has a second current I5 flowing through it which is split into a current I5n through the second input transistor 5n and a current I51 through the third input transistor 51.

The currents I52, I5n, I51 through the individual transistors have a square dependence on the gate-source voltages Vgs which are respectively across these transistors, as per $$Ids = (Vgs - Vth)^2 \quad (6),$$

said gate-source voltages in turn being dependent on the voltages V42, V4n, V41. Ids in equation (6) represents one of the currents through these transistors 52, 5n, 51; Vth denotes the threshold voltage of a respective transistor 52, 5n, 51.

The current I5 through the parallel circuit comprising the two transistors 5n, 51 is dominated by the current which flows through the transistor 5n, 51 with the larger gate-source voltage. On account of the square dependency of the currents I5n, I51 through these transistors in the gate-source voltage, the current I5 through the parallel circuit corresponds approximately to the current through the transistor 5n, 51, which is actuated by the larger of the two data signals V4n, V41. The current I5 is therefore dominated by the larger of the two data signals V4n, V41, which is synonymous with maximum formation.

In this circuit, the error signal S30 is available at a circuit node 56 which firstly has a current flowing into it which corresponds to the second input current I5 and is generated from the second input current I5 by means of a current mirror 545, 546, and which secondly has a current flowing out of it which is generated from the first input current I52 by means of a first current mirror 543, 544 and a second current mirror 541, 542. In this circuit, the output signal S30 is dependent on which of the two input currents I5, I52 is larger. If the first input current I52 is larger, that is to say if the supply signal V42 is larger, then the error signal S30 assumes a low value, that is to say a level which corresponds approximately to the lower supply potential VSSint. If, conversely, the second input current I5 is larger, said current being determined substantially by the larger of the two data signals V4n, V41, that is to say if one of the two data signals V4n, V41 is larger than the supply signal V42, then the output signal S30 assumes a high level, that is to say a level which corresponds approximately to the internal supply potential VDDint.

While the invention disclosed herein has been described in terms of several preferred embodiments, there are numerous alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An interface circuit comprising:
   at least one supply input;
   at least one data input; and
   an error detection circuit connected to the at least one supply input and to the at least one data input, the error detection circuit configured to compare a supply signal applied to the at least one supply input with a data signal applied to the at least one data input and to generate an error signal based on the comparison of the supply signal and the data signal.

2. The interface circuit of claim 1 wherein the error detection circuit is designed to generate an error-indicating level for the error signal when a sum made up of the supply signal applied to the at least one supply input and an offset is smaller than the data signal applied to the at least one data input.

3. The interface circuit of claim 1 wherein the at least one data input comprises at least two data inputs, and wherein the error detection circuit is designed to generate an error-indicating level for the error signal when a sum made up of the supply signal applied to the at least one supply input and an offset is smaller than the data signal on at least one of the at least two data inputs.

4. The interface circuit of claim 2 wherein the offset is equal to zero.

5. The interface circuit of claim 1 wherein the error detection circuit comprises at least one comparator connected to the at least one supply input and to the at least one data input, wherein the comparator provides a comparator signal, and wherein the error signal is dependent on the comparator signal.

6. The interface circuit of claim 1 wherein the error detection circuit comprises a level reduction circuit connected to the at least one supply input and to the at least one data input, wherein the level reduction circuit is configured to receive at least one supply signal applied to the at least one supply input and at least one data signal applied to the at least one data input and generate at least one reduced-level supply signal and at least one reduced-level data signal.

7. The interface circuit of claim 6 wherein the level reduction circuit is connected to a comparator circuit, wherein the at least one reduced-level supply signal and the at least one reduced-level data signal are supplied to the comparator, and wherein the comparator provides the error signal.

8. The interface circuit of claim 7 wherein the at least one data input comprises at least two data inputs, wherein the level reduction circuit generates at least two reduced-level data signals, and wherein the comparator circuit is designed to compare a maximum for the at least two reduced-level data signals with the at least one reduced-level supply signal and to generate the error signal on the basis of this comparison.

9. The interface circuit of claim 6 wherein the level reduction circuit is configured to reduce the level of the at least one supply signal supply signal by a reduction value to a prescribed level.

10. The interface circuit of claim 9 wherein the level reduction circuit is further configured to reduce the level of the at least one data signal by the same reduction value as the supply signal.

11. The interface circuit of claim 9 wherein the level reduction circuit is configured to reduce the level of the at least one data signal by a value which corresponds to the reduction value of the supply signal plus an offset.

12. The interface circuit of claim 1 further comprising a power supply circuit connected to the at least one supply input.

13. The interface circuit of claim 1 further comprising a protective circuit coupled between the at least one supply input and the at least one data input.

14. The interface circuit of claim 13 wherein the protective circuit includes at least one diode connected between the at least one data input and the at least one supply input.

15. A method of detecting an interruption in a power supply, the method comprising:
   receiving a supply signal at a supply input;
   receiving a data signal at a data input;
   comparing the supply signal received at the supply input with the data signal received at the data input; and
   generating an error signal based on the comparison of the supply signal and the data signal, wherein the error signal indicates whether an interruption in the power supply exists.

16. The method of claim 15 wherein the error signal is at an error-indicating level when a sum made up of the supply signal and an offset is smaller than the data signal.

17. The method of claim 15 further comprising the steps of delivering the data signal to a signal processing circuit and providing a supply voltage for the signal processing circuit.

18. An interface circuit configured for connection to a processing circuit, the interface circuit comprising:
   at least one supply input;
   at least one data input;
   a power supply output configured to deliver a power supply to the processing circuit;
   a data output configured to deliver a data signal received at the at least one data input to the processing circuit; and
   an error detection circuit connected to the at least one supply input and to the at least one data input, the error detection circuit configured to compare a supply signal received at the least one supply input with the data signal received at least one data input and to generate an error signal based on the comparison of the supply signal and the data signal.

19. The interface circuit of claim 18 wherein the error detection circuit is designed to generate an error-indicating level for the error signal when a sum made up of the supply signal received at the at least one supply input and an offset is smaller than the data signal received at the least one data input.

20. The interface circuit of claim 18 further comprising a protective circuit coupled between the at least one supply input and the at least one data input, wherein the protective circuit includes at least one diode connected between the at least one data input and the at least one supply input.

* * * * *